United States Patent [19]

Hsu

[11] Patent Number: 6,153,498
[45] Date of Patent: Nov. 28, 2000

[54] METHOD OF FABRICATING A BURIED CONTACT

[75] Inventor: Chen-Chung Hsu, Taichung, Taiwan

[73] Assignee: United Microelectronics Corp., Taiwan

[21] Appl. No.: 09/191,247

[22] Filed: Nov. 12, 1998

[51] Int. Cl.⁷ .................. H01L 21/425; H01L 21/336; H01L 21/76
[52] U.S. Cl. .................. 438/526; 438/197; 438/233; 438/238; 438/533; 438/647; 438/524; 438/514; 438/527; 438/453; 438/666
[58] Field of Search ................. 438/297, 304, 438/305, 306, 307, 229, 230, 232, 231, 238, 197, 199, 200, 533, 303, 526, 586, 647, 659, 524, 514, 453, 527, 975, 666, 233

[56] References Cited

U.S. PATENT DOCUMENTS 5,525,552   6/1996   Huang ........................ 438/297

*Primary Examiner*—Charles Bowers
*Assistant Examiner*—Thanhha Pham
*Attorney, Agent, or Firm*—Blakely Sokoloff Taylor & Zafman

[57] ABSTRACT

A method of fabricating a buried contact avoids high resistance at a junction by forming a polysilicon layer in a trench. Thus, the current passage is not cut by the trench. The resistance of the trench junction is decreased.

10 Claims, 4 Drawing Sheets

METHOD OF FABRICATING A BURIED CONTACT

BACKGROUND OF THE INVENTION

1. Field of Invention

The present invention relates to a semiconductor fabricating method. More particularly the present invention relates to a method of forming a buried contact.

2. Description of Related Art

SRAM, an acronym for Static Random Access Memory, is one of the fastest operating semiconductor memory devices widely used in computer equipment. An SRAM can be divided into two structural regions, namely, a memory cell region and a peripheral circuit region. The memory cell is used for storing binary data, whereas the peripheral circuit region has a number of address decoders, which are used to decode memory cell addresses issued from the memory cell region as well as to control related memory circuits.

In the past, most SRAM contact window structures were formed above the source/drain region. With the trend toward increased integration density, the conventional contact window structures turn out to be inefficient. Consequently, a buried contact structure suitable for fabricating local interconnects has been introduced. The buried contact structure is capable of reducing area occupation by up to 25%, for example, in SRAM. Hence, buried contact structure is indispensable in the fabrication of high-density electronic products.

In the conventional process of forming a buried contact, the trench can easily punch through the $N^-$ (source/drain) junction. Therefore, the buried contact is in contact with the substrate. The junction thus is cut off and high resistance occurs at the junction.

FIGS. 1A through 1F are cross-sectional views of a portion of a semiconductor device showing the conventional process of fabricating a buried contact.

In FIG. 1A, a shallow trench isolation structure (STI) 102 is formed in a semiconductor substrate 100. A patterned gate oxide layer 104 and a first patterned polysilicon layer 106 are formed in sequence over the substrate 100. An $N^+$ ion implantation is performed to form a $N^+$ junction 108 in the substrate 100.

In FIG. 1B, a second polysilicon layer 110 and silicide layer 112 are formed over the substrate 100.

In FIG. 1C, the silicide layer 112, the first polysilicon layer 110, and a second polysilicon layer 106 are patterned to form a gate 114 and a buried contact 116. The buried contact 116 is electrically coupled with the $N^+$ junction 108. A trench 118, which punches through the $N^+$ junction 108 and exposes the substrate 100, is often formed.

In FIG. 1D, an $N^-$ ion implantation is performed to form an $N^-$ junction 120 in the substrate 100. Because the trench 118 punches through the $N^+$ junction 108, the $N^-$ junction 112 simultaneously forms below the trench 118.

In FIG. 1E, spacer layer 124 are formed on the substrate 100. Due to the existence of the trench 118, spacer layers 124 are also formed in the trench 118.

In FIG. 1F, an $N^-$ ion implantation is performed. An $N^+$ junction 126 is formed in the substrate 100. The $N^+$ junction 126 is located between the $N^+$ junction 108 and the $N^-$ junction 120. In the conventional process, the spacer layer 124 is formed in the trench 118 (FIG. 1D). Trench 118 punches through the $N^+$ junction 108 and high resistance thus occurs.

In the conventional process of forming a buried contact, the trench easily punches through the $N^+$ (source/drain) junction. Therefore, the buried contact is in contact with the substrate. The junction thus is cut off. In cases where the trench does not completely punch through the $N^+$ (source/drain) junction, high resistance at the junction still occurs.

SUMMARY OF THE INVENTION

Accordingly, the present invention provides a method of fabricating a buried contact. In the present invention, the high resistance at the junction can be avoided. Polysilicon layers are formed in a trench. Thus, the current passage is not cut off when forming a trench. The resistance of the trench junction is decreased.

To achieve these and other advantages and in accordance with the purpose of the invention, as embodied and broadly described herein, the invention provides a method of fabricating a buried contact. The method comprises the steps of providing a substrate having an isolation structure thereon. A gate oxide layer and a first conductive layer are formed in sequence over the substrate. An $N^+$ ion implantation is performed to form a first $N^+$ junction in the substrate. A second conductive layer and a silicide layer are formed over the substrate. The silicide layer, the second conductive layer, and the first conductive layer are patterned to form a gate and a buried contact. The buried contact is electrically coupled with the $N^+$ junction. An $N^+$ ion implantation is performed to form a first $N^-$ junction in the substrate. Polysilicon spacers are formed over the substrate. A second $N^+$ ion implantation is performed to form a second $N^+$ junction in the substrate. The polysilicon spacers are doped. The silicide layer is used as an etching mask. The polysilicon spacers are etched back by using the substrate as an etching stop layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
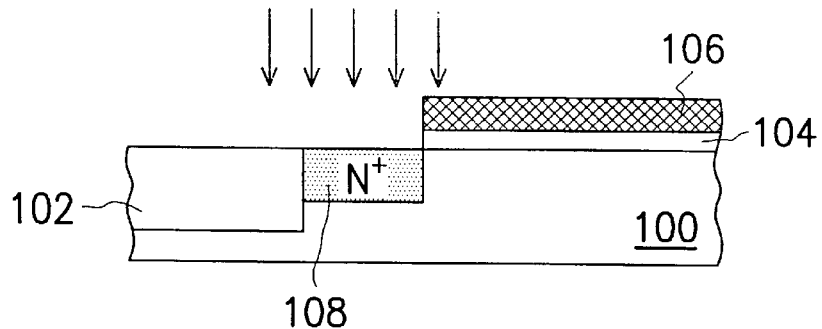
FIGS. 1A through 1F are cross-sectional views of a portion of a semiconductor device showing the conventional process of fabricating a buried contact.
Figure 1B:
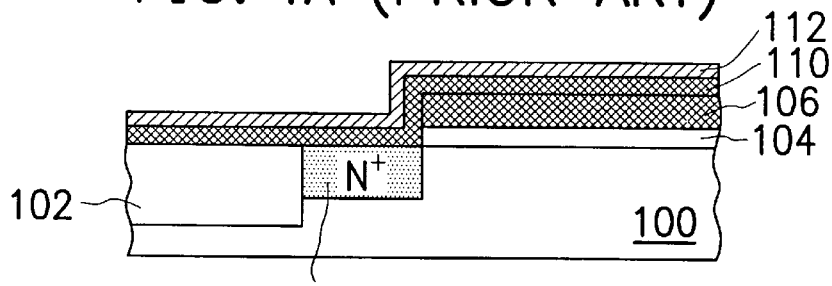
Figure 1C:
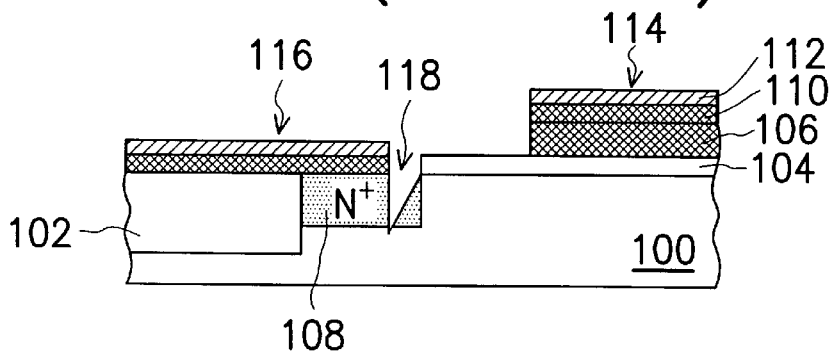
Figure 1D:
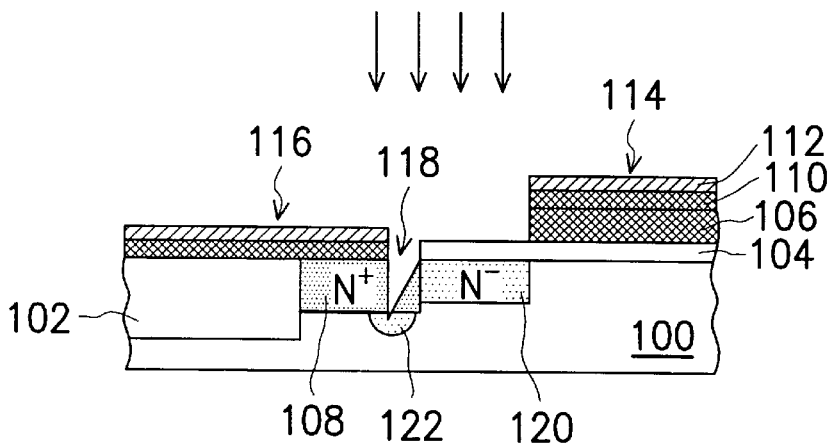
Figure 1E:
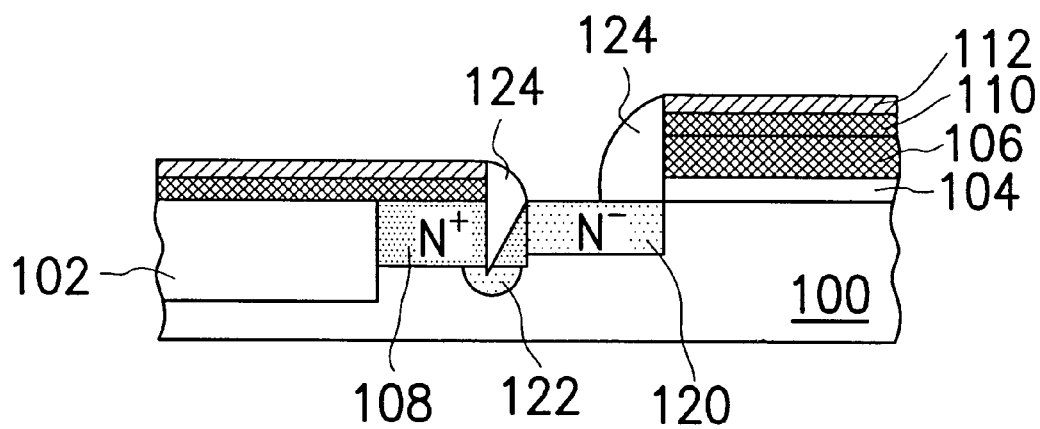
Figure 1F:
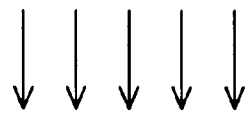
Figure 1F:
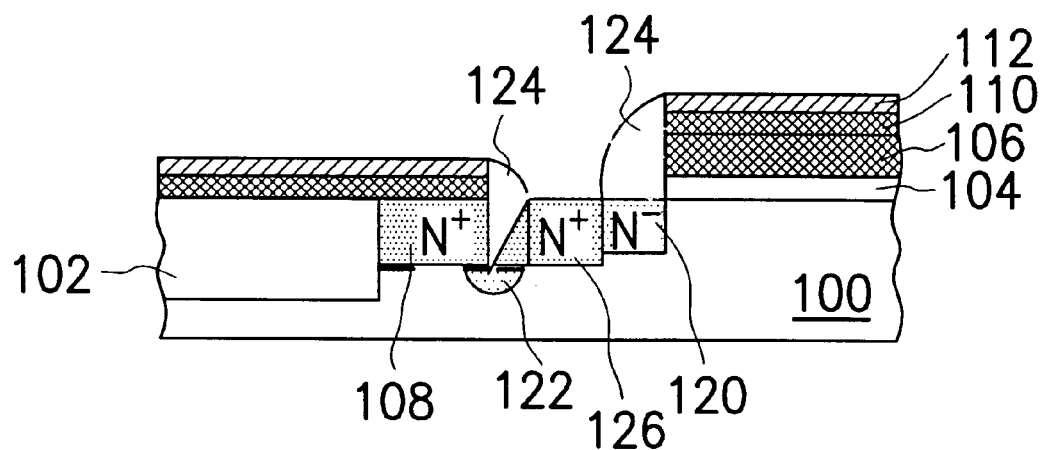

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2G are cross-sectional views of a portion of a semiconductor device showing the method of fabricating a buried contact according to one preferred embodiment of the inventions.

Figure 2A:
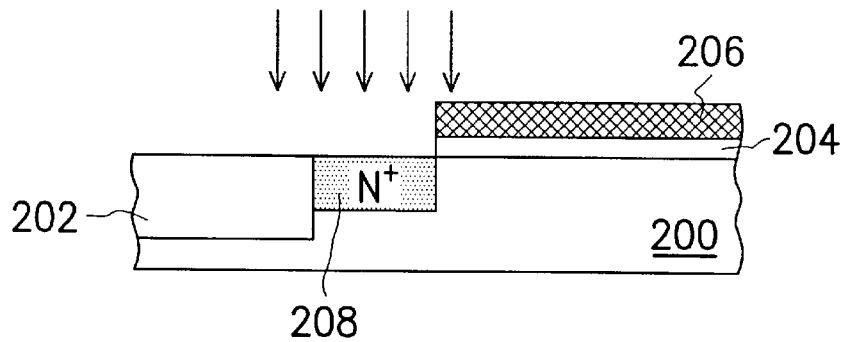
FIGS. 2A through 2G are cross-sectional views of a portion of a semiconductor device shoe the method of fabricating a buried contact according one preferred embodiment of the inventions.

In FIG. 2A, an isolation structure 202, such as a shallow trench isolation structure, is formed in a semiconductor substrate 200. A patterned gate oxide layer 204 and a first conductive layer 206, such as a polysilicon layer, are formed in sequence over the substrate 200. An $N^+$ ion implantation is performed to form a first $N^+$ junction 208 in the substrate 200.

Figure 2B:
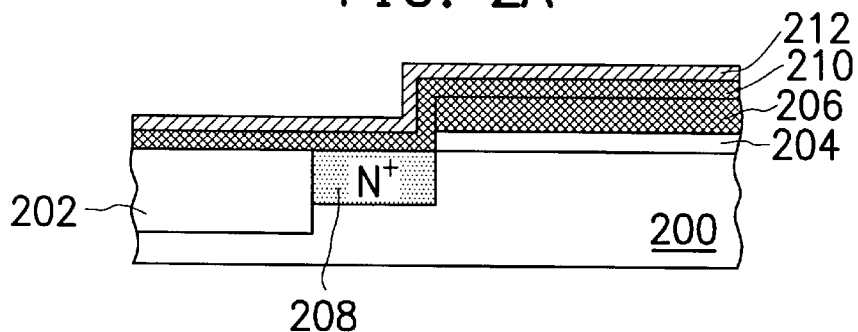

In FIG. 2B, a second conductive layer 210, such as a polysilicon layer, and a silicide layer 212 are formed over the substrate 200.

Figure 2C:
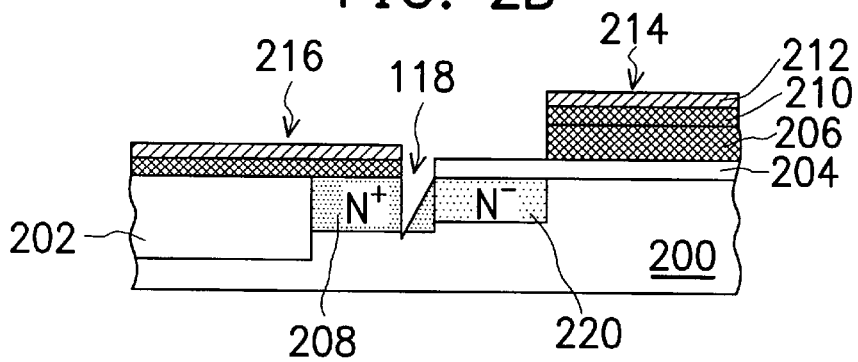

In FIG. 2C, the silicide layer 212, the second conductive layer 210, and the first conductive layer 206 are patterned to form a gate 214 and a buried contact 216. The buried contact 216 is electrically coupled with a first $N^+$ junction 208. A trench 218 is often formed in this step. The trench 218 punches through the first $N^+$ junction 208 and exposes the substrate 200.

Figure 2D:
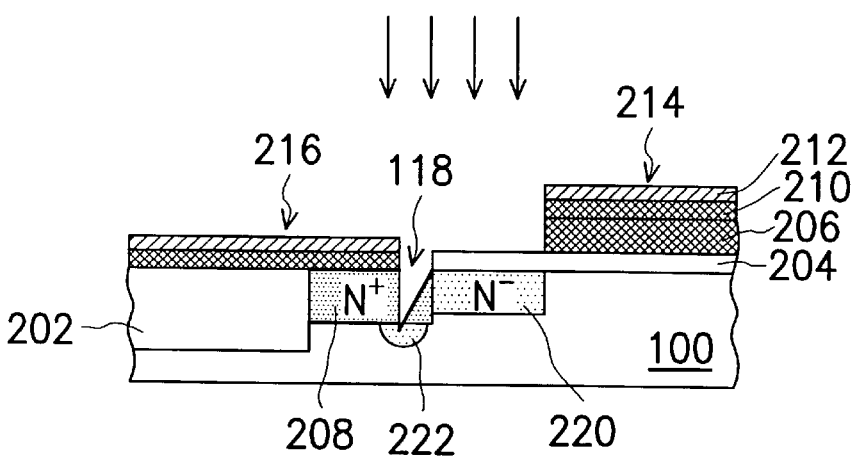

In FIG. 2D, an $N^-$ ion implantation is performed to form a second $N^-$ junction 220 on the substrate 200. Because the trench 218 punches through the first $N^+$ junction 208, a second $N^+$ junction 222 is formed below the trench 218 in the substrate 200.

Figure 2E:
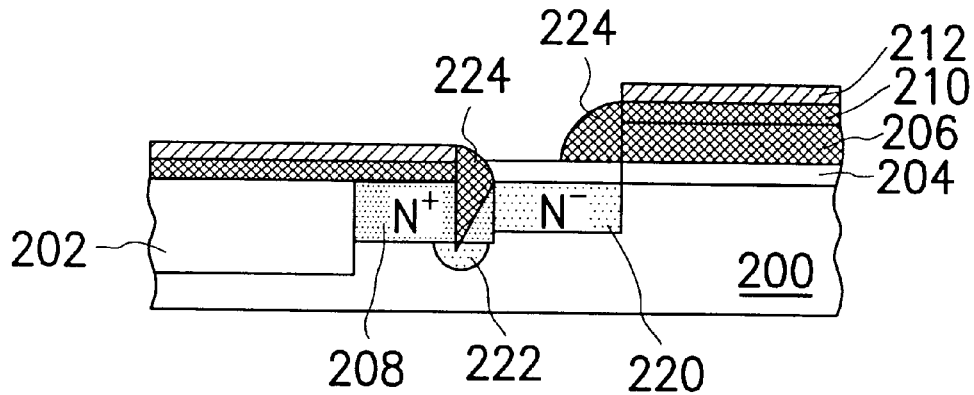

In FIG. 2E, polysilicon spacers 224 are formed over the substrate 200. The polysilicon spacers 224 are formed in the trench 218 and on the sidewalls of first conductive layer 206 and second conductive layer 210.

Figure 2F:
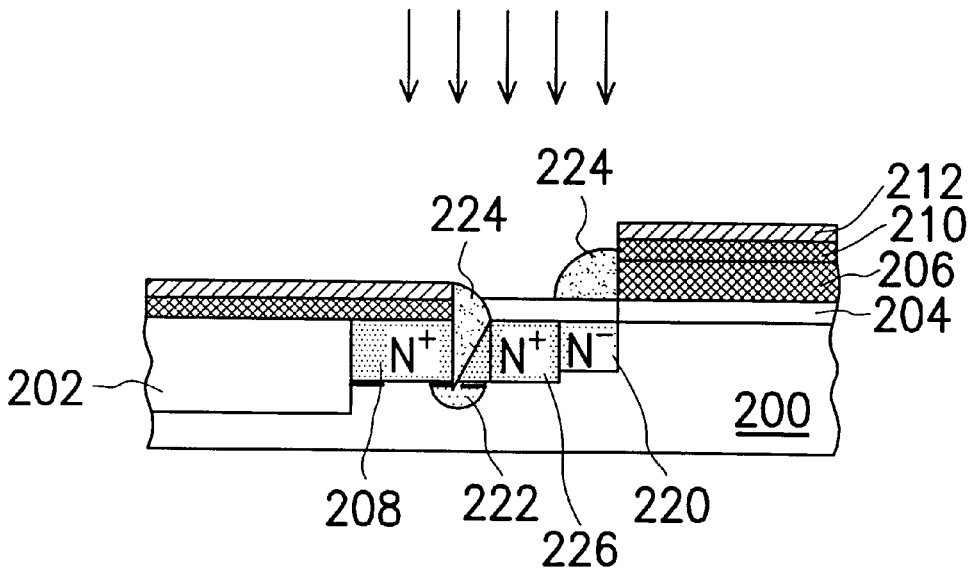

In FIG. 2F, an $N^+$ ion implantation is performed to form a third $N^+$ junction 226 in the substrate 200. The third $N^+$ junction 226 is between the first $N^+$ junction 208 and the $N^-$ junction 220. The polysilicon spacer layers 224 are also doped while performing the $N^+$ ion implantation. The resistance of polysilicon spacers 224 is decreased.

Figure 2G:
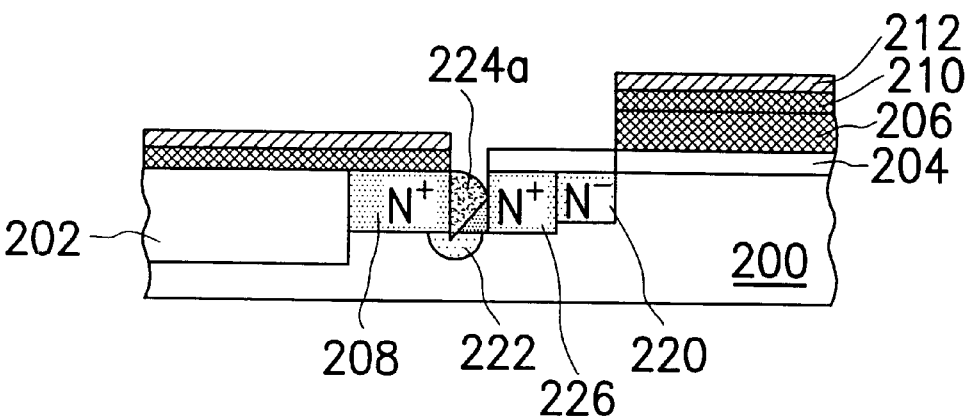

In FIG. 2G, the silicide layer 212 is used as an etching mask. The polysilicon spacer layers 224 are etched back so that the polysilicon spacer layer 224 on the sidewall of the gate 214 is removed and a portion of the polysilicon spacer layer 224 on a sidewall of the buried contact 216 remains. The etching back step is performed for a predetermined time. A polysilicon spacer layer 224a remains in the trench 218.

In the present invention, the polysilicon spacer 224a remains in the trench 218. Thus, the current passage of the $N^+$ junction 208 is not cut off by the trench 218.

Additionally, the buried contact according to the present invention is used to reduce the resistance in terms of the $N^-$ junction whether or not overetching occurs. Thus, the reliability of the SRAM process is increased.

It will be apparent to those skilled in the art that various modifications and variations can be made to the structure of the present invention without departing from the scope or spirit of the invention. For example, the N-type ion implantation can be changed to a P-type ion implantation to form a P-type device, such as a PMOS. In view of the foregoing, it is intended that the present invention cover modifications and variations of this invention provided they fall within the scope of the following claims and their equivalents.

What is claimed is:

1. A method of fabricating a buried contact comprising the steps of:

providing a substrate having an isolation structure thereon;

forming a patterned gate oxide layer and a first patterned conductive layer over the substrate;

performing a first $N^+$ ion implantation to form a first $N^+$ junction in the substrate;

forming a second conductive layer and a silicide layer over the substrate;

patterning the silicide layer, the second conductive layer, and the first conductive layer to form a gate and a buried contact, wherein the buried contact is electrically coupled with the first $N^+$ junction;

performing an $N^-$ ion implantation to form a first $N^-$ junction in the substrate using the gate and the buried contact as masks;

forming polysilicon spacers on sidewalls of the gate and the buried contact;

performing a second $N^+$ ion implantation to form a second $N^+$ junction in the substrate using the gate, the buried contact and the polysilicon spacers as masks, wherein the polysilicon spacers are doped; and etching back the polysilicon spacers so that the polysilicon spacer on the sidewall of the gate is removed and a portion of the polysilicon spacer on the sidewall of the buried contact remains.

2. The method of claim 1, wherein the first conductive layer includes a polysilicon layer.

3. The method of claim 1, wherein the second conductive layer includes a polysilicon layer.

4. The method of claim 1, wherein the step of etching back the polysilicon spacers further includes etching with a predetermined time by using the silicide layer as an etching mask so that the polysilicon spacer on the sidewall of the gate is removed.

5. The method of claim 1, wherein the second $N^+$ junction is between the first $N^+$ junction and the first $N^-$ junction.

6. A method of fabricating a buried contact comprising the steps of:

providing a substrate having an isolation structure thereon;

forming a patterned gate oxide layer and a first patterned conductive layer over the substrate;

performing a first $P^+$ ion implantation to form a first $P^+$ junction in the substrate;

forming a second conductive layer and a silicide layer over the substrate;

patterning the silicide layer, the second conductive layer, and the first conductive layer to form a gate and a buried contact, wherein the buried contact is electrically coupled with the first $P^+$ junction;

performing an $P^-$ ion implantation to form a first $P^-$ junction in the substrate using the gate and the buried contact as masks;

forming polysilicon spacers on sidewalls of the gate and the buried contact;

performing a second $P^+$ ion implantation to form a second $P^+$ junction in the substrate using the gate, the buried contact and the polysilicon spacers as masks, wherein the polysilicon spacers are doped; and etching back the polysilicon spacers so that the polysilicon spacer on the sidewall of the gate is removed and a portion of the polysilicon spacer on the sidewall of the buried contact remains.

7. The method of claim 6, wherein the first conductive layer includes a polysilicon layer.

8. The method of claim 6, wherein the second conductive layer includes a polysilicon layer.

9. The method of claim 6, wherein the step of etching back the polysilicon spacer further includes etching with a predetermined time by using the silicide layer as an etching mask so that the polysilicon spacer on the sidewall of the gate is removed.

10. The method of claim 6, wherein the second $P^+$ junction is between the first $P^+$ junction and the first $P^-$ junction.

* * * * *

UNITED STATES PATENT AND TRADEMARK OFFICE
CERTIFICATE OF CORRECTION

PATENT NO.   : 6,153,498
DATED        : November 28, 2000
INVENTOR(S)  : Hsu

It is certified that error appears in the above-identified patent and that said Letters Patent is hereby corrected as shown below:

Item [75], Inventor, delete "Taichung" and insert -- Taichung City --.

<u>Column 2,</u>
Line 52, delete "a semiconductor device shoe the method" and insert
-- a semiconductor device showing the method --.

Signed and Sealed this

Eighth Day of January, 2002

*Attest:*

*Attesting Officer*

JAMES E. ROGAN
*Director of the United States Patent and Trademark Office*